United States Patent
Elliott et al.

(10) Patent No.: US 8,854,096 B1
(45) Date of Patent: Oct. 7, 2014

(54) SYSTEM AND METHOD OF CLOCK GENERATION IN HIGH SPEED SERIAL COMMUNICATION

(71) Applicants: Michael R. Elliott, Summerfield, NC (US); Brad P. Jeffries, Browns Summit, NC (US); Michael D. Keane, Adare (IE); Johan H. Mansson, Puzol (ES); Axel Zafra Petersson, Foios (ES)

(72) Inventors: Michael R. Elliott, Summerfield, NC (US); Brad P. Jeffries, Browns Summit, NC (US); Michael D. Keane, Adare (IE); Johan H. Mansson, Puzol (ES); Axel Zafra Petersson, Foios (ES)

(73) Assignee: Analog Devices Technology, Hamilton (BM)

( * ) Notice: Subject to any disclaimer, the term of this patent is extended or adjusted under 35 U.S.C. 154(b) by 0 days.

(21) Appl. No.: 14/062,368

(22) Filed: Oct. 24, 2013

(51) Int. Cl.
*H03L 7/06* (2006.01)
*H03K 17/16* (2006.01)

(52) U.S. Cl.
CPC ...................................... *H03K 17/16* (2013.01)
USPC .......................................... 327/156; 327/147

(58) Field of Classification Search
USPC .................................................. 327/147, 156
See application file for complete search history.

(56) References Cited

U.S. PATENT DOCUMENTS

| | | | | |
|---|---|---|---|---|
| 5,530,377 A * | 6/1996 | Walls | .............................. | 326/30 |
| 8,547,134 B1 * | 10/2013 | Zafra-Petersson et al. | ..... | 326/30 |
| 2010/0262747 A1 * | 10/2010 | Gaskins et al. | ............... | 710/311 |
| 2011/0257953 A1 * | 10/2011 | Li et al. | .......................... | 703/14 |
| 2013/0007500 A1 * | 1/2013 | Fiedler | ......................... | 713/501 |
| 2013/0057766 A1 * | 3/2013 | Hudson et al. | ............... | 348/571 |
| 2013/0342244 A1 * | 12/2013 | Kawasaki | ..................... | 327/113 |
| 2014/0107997 A1 * | 4/2014 | Li et al. | .......................... | 703/13 |

* cited by examiner

*Primary Examiner* — Adam Houston

(74) *Attorney, Agent, or Firm* — Kenyon & Kenyon LLP

(57) ABSTRACT

A transmission system may include an oscillator, a serializer, and a driver. The oscillator may generate at least two clock signals. The serializer may modulate a plurality of data streams based upon the at least two clock signals and a plurality of channels of data. The driver may receive and combine the plurality of data streams into a single output data stream, wherein the single output data stream has a clock frequency higher than frequency of each of the at least two clock signals.

20 Claims, 6 Drawing Sheets

200

100

200

600

SYSTEM AND METHOD OF CLOCK GENERATION IN HIGH SPEED SERIAL COMMUNICATION

BACKGROUND

Serial transmitters allow for the transmission of data sequentially by bit, over a given channel. As fast data conversion is often a necessity, high speed serial transmitters must be implemented to achieve various speed requirements. A serial transmitter may consist of, for example, a serializer in one stage followed by a driver component in another stage. A common implementation of constructing a serializer can be made by combining partial stream bit streams, such as a half speed bit stream, through a multiplexer to achieve the full speed bit rate. However, the speed of the serial transmitter is affected by the implementation of the serializer and the driver component, since the speed of the serial transmitter is dominated by the circuit implementation and design choice. A serializer may generate a full speed clock signal, which converts to two half speed clock signals used to serialize the two half speed bit streams. As the speed of transmission increases with technology advances, the full speed clock signal generation in the serializer becomes a performance bottleneck.

Thus there remains a need in the art, for a high speed serial transmitter that can overcome the speed limitations of its individual components. There further remains a need in the art for an efficient, high speed current mode driver that can combine a driver with multiplexing functionality in a single stage while operating at lower power.

DETAILED DESCRIPTION

Figure 1:
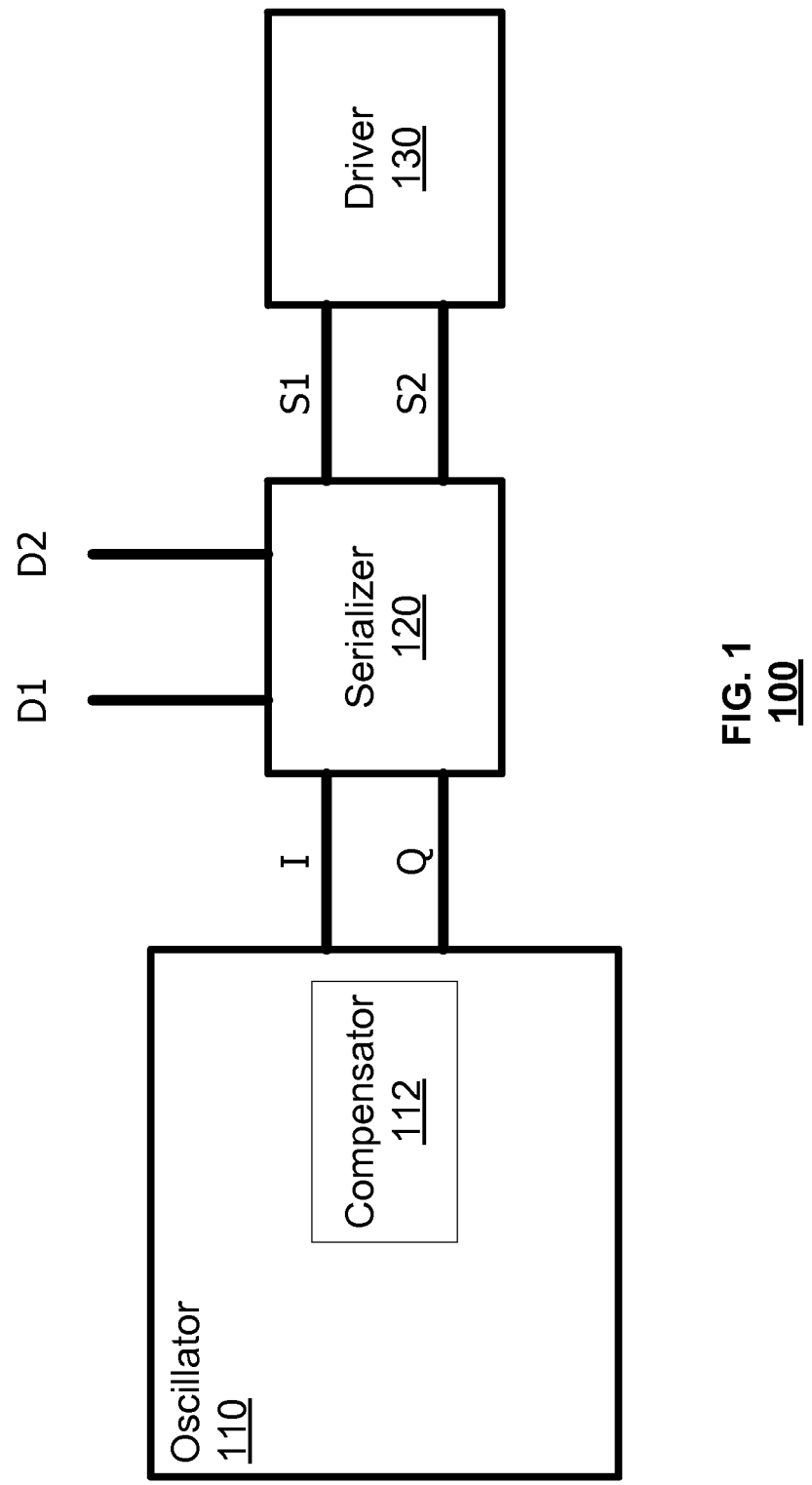
FIG. 1 illustrates an exemplary transmission system according to an embodiment.

FIG. 1 illustrates an exemplary transmission system 100 according to an embodiment. According to an embodiment, transmission system 100 may include an oscillator 110, a serializer 120, and a driver 130. The oscillator 110 may generate at least two clock signals (for example I and Q). The serializer 120 may modulate a plurality of data streams (for example S1 and S2) based upon the at least two clock signals and a plurality of channels (for example D1 and D2 respectively). The driver 130 may receive and combine the plurality of data streams into a single output data stream, wherein the single output data stream has a clock frequency higher than frequency of each of the at least two clock signals.

According to an embodiment, the transmission system 100 may include a compensator 112, which may be included in the oscillator 110. The serializer 120 may modulate a plurality of data streams (for example S1 and S2) based upon the at least two clock signals and a plurality of channels (for example D1 and D2 respectively), for example, by resampling data stream S1 based upon data from channel D1 using clock signal I, and resampling data stream S2 based upon data from channel D2 using clock signal Q.

Clock signals I and Q may each include a pair of opposite clock signals, for example, I may include opposite clock signals i and ib, and Q may include opposite clock signals q and qb. Clock signals I and Q may be orthogonal or 90 degrees out of phase relative to each other. For example, q may be a clock signal 90 degrees later or earlier than i, and qb may be a clock signal 90 degrees later or earlier than ib. Using these half clock frequency clock signals, data streams S1 and S2 may also be at half clock frequency but S1 and S2 may be orthogonal to each other (90 degrees out of phase relative to each other). S1 and S2 may be considered quadrature signals.

According to an embodiment, the driver 130 may combine the orthogonal data streams (for example S1 and S2) into a full clock frequency output data stream, by for example, XOR-ing data streams S1 and S2 to result in the output using an XOR type logic gate as well as other components such as power amplifiers, etc.

According to an embodiment, the oscillator 110 may include a ring oscillator circuit configured within a phase locked loop (PLL), to generate clock signals I and Q that may be orthogonal or 90 degrees out of phase relative to each other. Alternatively, the oscillator 110 may include other configurations, such as a delay locked loop (DLL), to generate clock signals I and Q that may be orthogonal or 90 degrees out of phase relative to each other. Various implementations are possible for the oscillator 110 to achieve similar I and Q clock signals.

According to an embodiment, the compensator 112 may adjust the clock signals I and Q to compensate for any phase errors to keep the clock signals I and Q orthogonal to each other. The PLL may be based on, for example a multi-stage voltage controlled oscillator (VCO) architecture configured to generate quadrature clock signals by design. For example, in a four stage differential VCO where each stage includes a differential inverter, four stages of inverters may form a ring to oscillate at a controlled clock frequency. The four stages of inverters may be tuned to adjust the oscillation clock frequency. The ring may be tapped for the quadrature clock signals I and Q, with phase offset of 90 degrees of the clock frequency. By this configuration, quadrature clock signals may be directly generated from the PLL configured oscillator and delivered to the serializer 120.

In the above configuration, clock signals generated and used in transmission system 100 only include half clock frequency signals, including the data streams, to generate the final output at full clock speed in the driver 130. Thus, accuracy, noise performance, and power performance may be improved.

Figure 2:
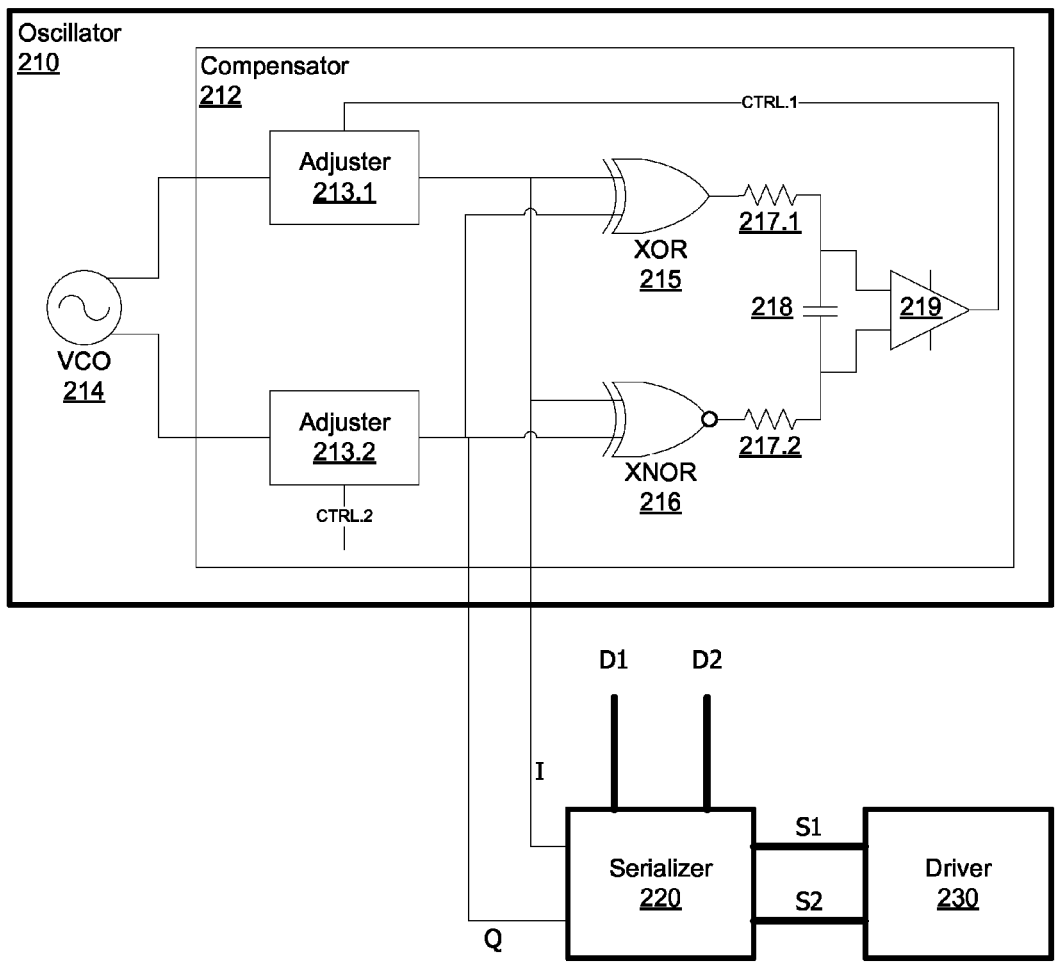
FIG. 2 illustrates an exemplary transmission system according to an embodiment.

FIG. 2 illustrates an exemplary transmission system 200. According to an embodiment, transmission system 200 may include an oscillator 210, a serializer 220, and a driver 230, as analogous to system 100 in FIG. 1. The oscillator 210 may include a compensator 212, and a voltage controlled oscillator (VCO) 214.

The VCO 214 may include a ring oscillator circuit.

The compensator 212 may include adjusters 213.1 and 213.2 to adjust the phase of clock signals I and Q. The clock signals I and Q may be connected to inputs of an XOR gate 215 and an XNOR gate 216 to produce outputs exactly opposite of each other. The outputs of the XOR gate 215 and the XNOR gate 216 are then fed into a low pass filter, such as illustrated that includes resistors 217.1 and 217.2 and capacitor 218 and amplifier 219. Amplifier 219 may generate a filtered voltage as a control signal CTRL.1 of adjuster 213.1. If the clock signals I and Q are not aligned as orthogonal relative to each other, this feedback control loop may cause CTRL.1 to increase or decrease to adjust the delay of clock signal I through the adjuster 213.1. Additionally, adjuster 213.2 may cause the clock signal Q to delay based upon the control signal CTRL.2, which may be generated by another feedback loop similar to CTRL.1, or may be fixed to a specific voltage level.

In the above configuration in FIG. 2, even if the clock signals generated from the VCO 214 are misaligned as orthogonal relative to each other, the compensator 212 may compensate and adjust the clock signals to become orthogonal, before feeding the adjusted clock signals to the serializer 220.

The clock signals need to be accurate system wide, as both rising and falling edges will dictate the output quality. One potential problem with the clock signals is that any phase misalignment from the expected 90 degrees may cause periodic jitter noise on the output. This may be more severe when the oscillator is located further away from the output driver. Thus, a compensator 212 that may be located more closely to the serializer and the driver on the system and/or silicon level may be used to compensate for any phase misalignment near the serializer and the driver to produce most aligned quadrature clock signals I and Q.

Figure 3:
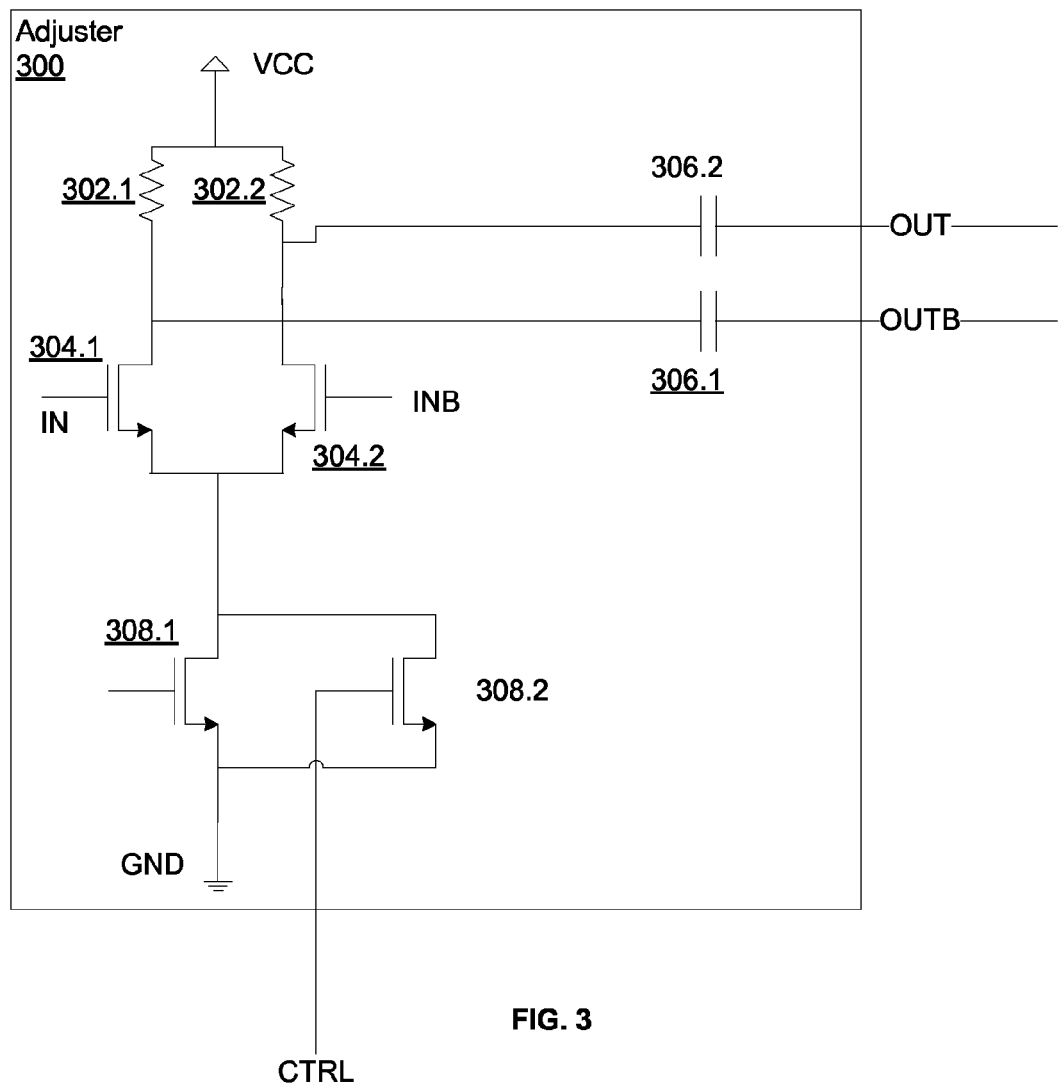
FIG. 3 illustrates an exemplary adjuster according to an embodiment.

FIG. 3 illustrates an exemplary adjuster 300 according to an embodiment. The adjuster 300 may be used as the adjuster 213.1 or the adjuster 213.2 in FIG. 2. The adjuster 300 may include a differential amplifier circuit with resistor 302.1 and transistor 304.1 forming one branch and resistor 302.2 and transistor 304.2 forming a second branch. The resistors 302.1 and 302.2 may be connected to a voltage supply VCC, and each connected to respective opposite outputs OUT and OUTB via capacitors 306.1 and 306.2. Transistors 304.1 and 304.2 may receive respective opposite inputs IN and INB on their gates.

The adjuster 300 may include current source control transistors (for example 308.1 and 308.2). At least one of the current source control transistors (for example 308.2) maybe connected to a control signal CTRL on the gate. The other current source control transistor (for example 308.1) may be connected to a preset control signal on the gate. In this configuration, by varying the control signal CTRL voltage level, the common current for transistors 304.1 and 304.2 may be increased or decreased, which in turn adjusts the delay for propagating the signals IN and INB through adjuster 300 to outputs OUT and OUTB.

According to an embodiment, IN and INB may be tied to i and ib of the unadjusted version of clock signal I, or tied to q and qb of the unadjusted version of clock signal Q. OUT and OUTB may become i and ib of the adjusted version of clock signal I, or q and qb of the adjusted version of clock signal Q. CTRL may be connected to CTRL.1 or CTRL.2 in FIG. 2.

According to the above configurations, the transmission systems may have the following benefits:

A) The random noise from the transmission system may be dominated by the noise from the VCO, inside the PLL. In high speed serial commination standards (for example the JESD204B), the random noise (random jitter) need to be very low (typically <1 ps jitter at data rate of 8 Gbps). On 0.18 um CMOS process for example, the VCO design become very challenging to meet the requirements for high speed and low noise. The high speed goal requires very small devices, but the low noise goal requires large devices inside the VCO to suppress noise. By halving the max frequency in the transmission system, the speed and noise requirements may be met.

B) The PLL and the oscillator may be easier to design due to lower clock frequency in the natural quadrature clock signals generation.

C) Lower power required in PLL and the oscillator and clock signal distribution/transmission circuitry in the transmission system, due to the lower clock frequency.

Figure 4:
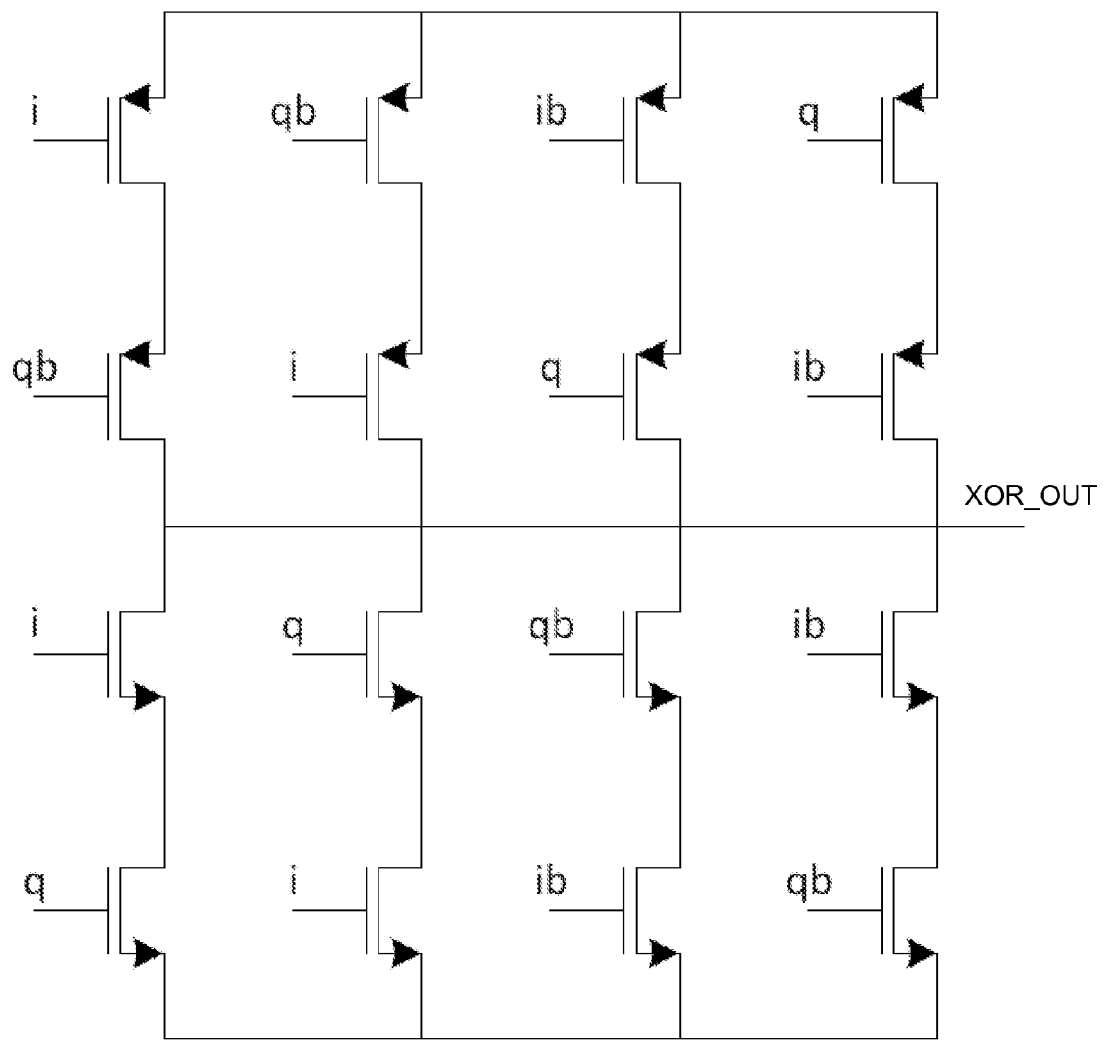
FIG. 4 illustrates an exemplary XOR gate according to an embodiment.

FIG. 4 illustrates an exemplary XOR gate according to an embodiment. XOR gate as illustrated includes a plurality of PMOS and NMOS transistors, receiving i and ib of the clock signal I and q and qb of the clock signal Q, to generate XOR_OUT.

Figure 5:
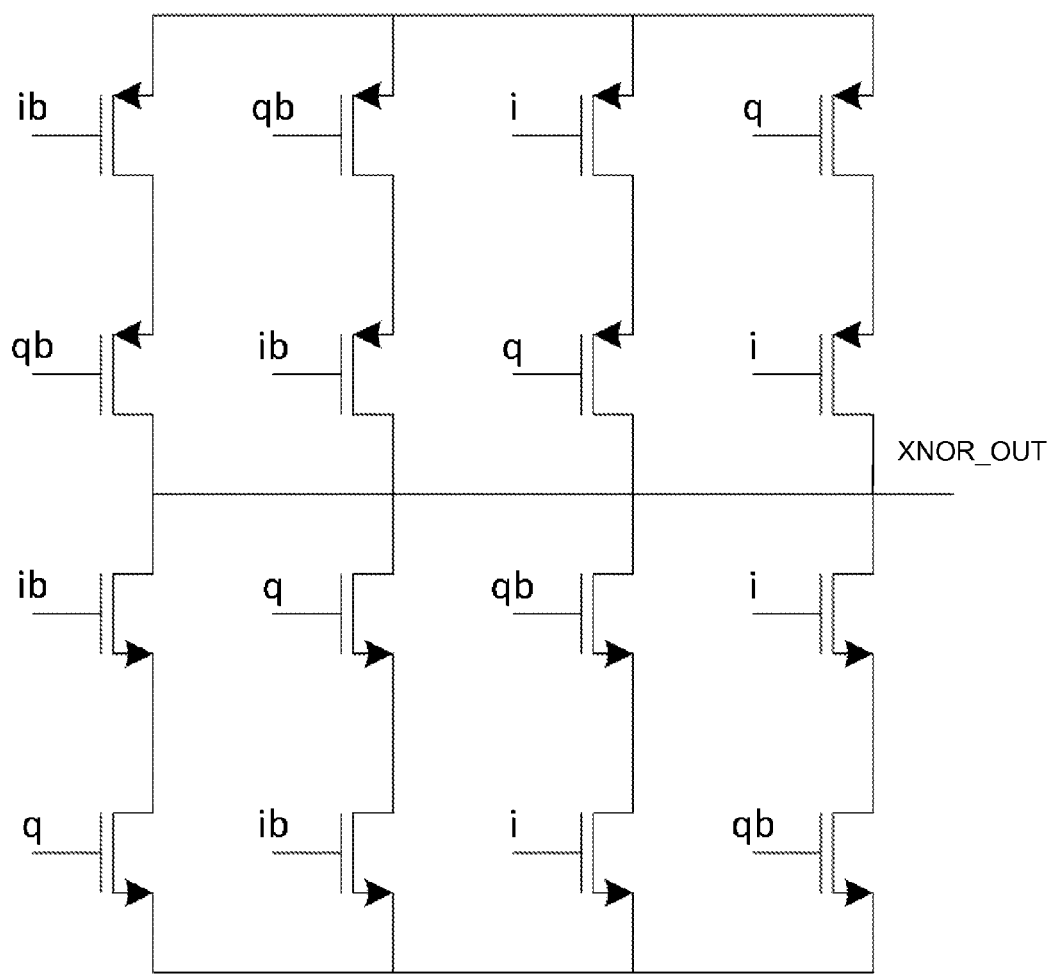
FIG. 5 illustrates an exemplary XNOR gate according to an embodiment.

FIG. 5 illustrates an exemplary XNOR gate according to an embodiment. XNOR gate as illustrated includes a plurality of PMOS and NMOS transistors, receiving i and ib of the clock signal I and q and qb of the clock signal Q, to generate XNOR_OUT, which may be opposite of XOR_OUT.

Figure 6:
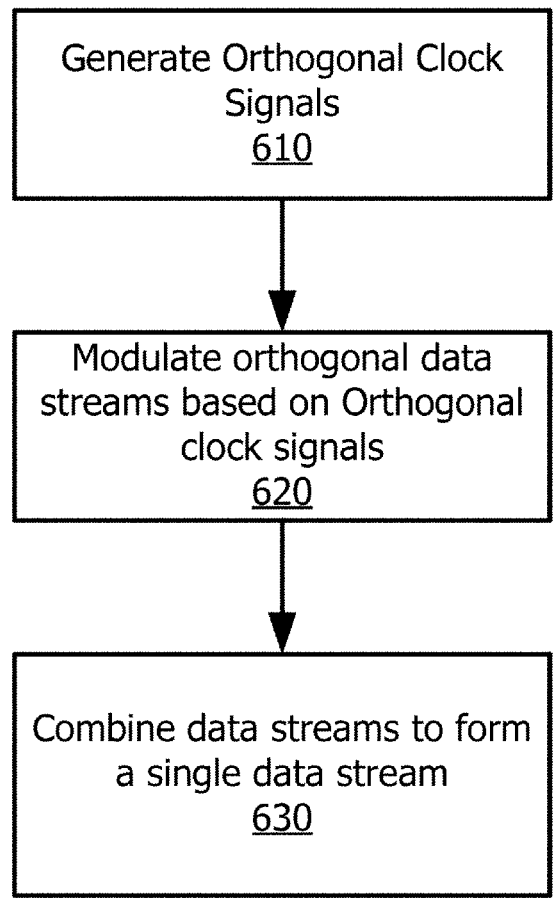
FIG. 6 illustrates an exemplary method according to an embodiment.

FIG. 6 illustrates an exemplary method 600 according to an embodiment.

At block 610, the oscillator 110 may generate at least two clock signals (for example I and Q).

At block 620, the serializer 120 may modulate a plurality of data streams (for example S1 and S2) based upon the at least two clock signals and a plurality of channels (for example D1 and D2 respectively).

At block 630, the driver 130 may receive and combine the plurality of data streams into a single output data stream, wherein the single output data stream has a clock frequency higher than frequency of each of the at least two clock signals.

It is appreciated that the disclosure is not limited to the described embodiments, and that any number of scenarios and embodiments in which conflicting appointments exist may be resolved.

Although the disclosure has been described with reference to several exemplary embodiments, it is understood that the words that have been used are words of description and illustration, rather than words of limitation. Changes may be made within the purview of the appended claims, as presently stated and as amended, without departing from the scope and spirit of the disclosure in its aspects. Although the disclosure has been described with reference to particular means, materials and embodiments, the disclosure is not intended to be limited to the particulars disclosed; rather the disclosure extends to all functionally equivalent structures, methods, and uses such as are within the scope of the appended claims.

The present specification describes components and functions that may be implemented in particular embodiments with reference to particular standards and protocols, the disclosure is not limited to such standards and protocols. Such standards are periodically superseded by faster or more efficient equivalents having essentially the same functions. Accordingly, replacement standards and protocols having the same or similar functions are considered equivalents thereof.

The illustrations of the embodiments described herein are intended to provide a general understanding of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Additionally, the illustrations are merely representational and may not be drawn to scale. Certain proportions within the illustrations may be exaggerated, while other proportions may be minimized. Accordingly, the disclosure and the figures are to be regarded as illustrative rather than restrictive.

One or more embodiments of the disclosure may be referred to herein, individually and/or collectively, by the term "disclosure" merely for convenience and without intending to voluntarily limit the scope of this application to any particular disclosure or inventive concept. Moreover, although specific embodiments have been illustrated and described herein, it should be appreciated that any subsequent arrangement designed to achieve the same or similar purpose may be substituted for the specific embodiments shown. This disclosure is intended to cover any and all subsequent adaptations or variations of various embodiments. Combinations of the above embodiments, and other embodiments not specifically described herein, will be apparent to those of skill in the art upon reviewing the description.

In addition, in the foregoing Detailed Description, various features may be grouped together or described in a single embodiment for the purpose of streamlining the disclosure. This disclosure is not to be interpreted as reflecting an intention that the claimed embodiments require more features than are expressly recited in each claim. Rather, as the following claims reflect, inventive subject matter may be directed to less than all of the features of any of the disclosed embodiments. Thus, the following claims are incorporated into the Detailed Description, with each claim standing on its own as defining separately claimed subject matter.

The above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

We claim:

1. A transmission system, comprising:
   an oscillator generating at least two clock signals;
   a serializer modulating a plurality of data streams based upon the at least two clock signals and a plurality of channels of data; and
   a driver receiving and combining the plurality of data streams into a single output data stream,
   wherein the single output data stream has a clock frequency higher than frequency of each of the at least two clock signals.

2. The transmission system of claim 1, wherein the oscillator comprises a VCO generating two clock signals that are orthogonal relative to each other in phase.

3. The transmission system of claim 1, wherein the oscillator comprises a PLL.

4. The transmission system of claim 1, wherein the oscillator comprises a ring oscillator oscillating at a clock frequency of the at least two clock signals that are orthogonal relative to each other in phase.

5. The transmission system of claim 1, wherein the oscillator comprises a compensator adjusting the phase of at least one of the clock signals to align the at least two clock signals to be orthogonal relative to each other in phase.

6. The transmission system of claim 5, wherein the compensator comprises at least an adjuster adjusting the phase of at least one of the clock signals based upon a control signal.

7. The transmission system of claim 5, wherein the compensator comprises at least an adjuster adjusting the phase of at least one of the clock signals.

8. The transmission system of claim 5, wherein the compensator comprises at least a sensing circuit producing a control signal based upon the phases of the clock signals to control an adjuster to adjust the phase of at least one of the clock signals.

9. The transmission system of claim 8, wherein the sensing circuit comprises at least one of an XOR gate, an XNOR gate, and a low pass filter.

10. The transmission system of claim 1, wherein the driver comprises an XOR gate to combine the plurality of data streams to generate the single output data stream.

11. A method, comprising:
    generating, by an oscillator, at least two clock signals;
    modulating, by a serializer, a plurality of data streams based upon the at least two clock signals and a plurality of channels of data; and
    receiving and combining, by a driver, the plurality of data streams into a single output data stream,
    wherein the single output data stream has a clock frequency higher than frequency of each of the at least two clock signals.

12. The method of claim 11, wherein the oscillator comprises a VCO generating two clock signals that are orthogonal relative to each other in phase.

13. The method of claim 11, wherein the oscillator comprises a PLL.

14. The method of claim 11, wherein the oscillator comprises a ring oscillator oscillating at a clock frequency of the at least two clock signals that are orthogonal relative to each other in phase.

15. The method of claim 11, wherein the oscillator comprises a compensator adjusting the phase of at least one of the clock signals to align the at least two clock signals to be orthogonal relative to each other in phase.

16. The method of claim 15, wherein the compensator comprises at least an adjuster adjusting the phase of at least one of the clock signals based upon a control signal.

17. The method of claim 15, wherein the compensator comprises at least an adjuster adjusting the phase of at least one of the clock signals.

18. The method of claim 15, wherein the compensator comprises at least a sensing circuit producing a control signal based upon the phases of the clock signals to control an adjuster to adjust the phase of at least one of the clock signals.

19. The method of claim 18, wherein the sensing circuit comprises at least one of an XOR gate, an XNOR gate, and a low pass filter.

20. The method of claim 11, wherein the driver comprises an XOR gate to combine the plurality of data streams to generate the single output data stream.

* * * * *